(12) United States Patent
Choi et al.

(10) Patent No.: US 8,872,215 B2
(45) Date of Patent: Oct. 28, 2014

(54) LIGHT EMITTING DEVICE AND LIGHT EMITTING DEVICE PACKAGE

(75) Inventors: Kwang Ki Choi, Seoul (KR); Hwan Hee Jeong, Seoul (KR); Sang Youl Lee, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 42 days.

(21) Appl. No.: 13/033,224

(22) Filed: Feb. 23, 2011

(65) Prior Publication Data

US 2011/0248302 A1    Oct. 13, 2011

(30) Foreign Application Priority Data

Apr. 13, 2010    (KR) .................. 10-2010-0033835

(51) Int. Cl.
*H01L 33/36* (2010.01)
*H01L 33/38* (2010.01)
*H01L 33/14* (2010.01)
*H01L 27/15* (2006.01)
*H01L 33/22* (2010.01)

(52) U.S. Cl.
CPC ....... *H01L 27/15* (2013.01); *H01L 2924/13091* (2013.01); *H01L 33/22* (2013.01); *H01L 2224/48091* (2013.01); *H01L 33/38* (2013.01)
USPC .. 257/99; 257/98; 257/E33.062; 257/E33.066

(58) Field of Classification Search
None
See application file for complete search history.

(56) References Cited

U.S. PATENT DOCUMENTS

| | | | | |
|---|---|---|---|---|
| 4,152,711 A | * | 5/1979 | Nakata | 257/79 |
| 5,021,361 A | * | 6/1991 | Kinoshita et al. | 438/23 |
| 6,274,890 B1 | * | 8/2001 | Oshio et al. | 257/98 |
| 6,399,407 B1 | * | 6/2002 | O'Brien et al. | 438/29 |
| 7,910,919 B2 | | 3/2011 | Yang et al. | |
| 2005/0006657 A1 | * | 1/2005 | Terashita | 257/98 |
| 2008/0128727 A1 | * | 6/2008 | Erchak et al. | 257/98 |
| 2008/0157099 A1 | * | 7/2008 | Yang et al. | 257/83 |
| 2009/0001385 A1 | * | 1/2009 | Skipor et al. | 257/79 |
| 2009/0009062 A1 | * | 1/2009 | Kathirgamanathan et al. | 313/504 |
| 2009/0230407 A1 | * | 9/2009 | Fan et al. | 257/79 |
| 2010/0317132 A1 | * | 12/2010 | Rogers et al. | 438/27 |

FOREIGN PATENT DOCUMENTS

| | | |
|---|---|---|
| CN | 101211963 A | 7/2008 |
| JP | 2001-127278 A | 5/2001 |
| JP | 2008-181969 A | 8/2008 |
| JP | 2008-288179 A | 11/2008 |
| JP | 2009-164648 A | 7/2009 |
| JP | 2009-266855 A | 11/2009 |

OTHER PUBLICATIONS

Wakahara et al, "Monothically-Integrated Digital Circuits with Light Emitting Diodes in Lattice-Matched Si/III-V-N/Si Heterostructure", 2010 IEEE Compound Semiconductor Integrated Circuit Symposium (CSICS), IEEE, 2010.*
Abstract cinformation on Wakahara (see above).*

* cited by examiner

*Primary Examiner* — Johannes P Mondt
(74) *Attorney, Agent, or Firm* — Ked & Associates, LLP

(57) ABSTRACT

A light emitting device according to the embodiment includes a first electrode; a light emitting structure including a first semiconductor layer, an active layer and a second semiconductor layer on the first electrode; a second electrode on the light emitting structure; and a control switch installed on the light emitting structure to control the light emitting structure.

21 Claims, 15 Drawing Sheets

LIGHT EMITTING DEVICE AND LIGHT EMITTING DEVICE PACKAGE

The present application claims priority of Korean Patent Application No. 10-2010-0033835 filed on Apr. 13, 2010, which is hereby incorporated by reference in its entirety.

BACKGROUND

The embodiment relates to a light emitting device and a light emitting device package.

A light emitting diode (LED) is a semiconductor light emitting device that converts current into light. The LED can generate light having high brightness, so that the LED has been expensively used as a light source for a display device, a vehicle, or a lighting device. In addition, the LED can represent a white color having superior light efficiency by luminescence materials or combining LEDs having various colors.

SUMMARY

The embodiment provides a light emitting device having a novel structure and a light emitting device package.

The embodiment provides a light emitting device having a switch function.

According to the embodiment, the light emitting device may include a first electrode, a light emitting structure including a first semiconductor layer, an active layer and a second semiconductor layer on the first electrode, a second electrode on the light emitting structure, and a control switch on the light emitting structure to control the light emitting structure.

According to the embodiment, the light emitting device may include a first electrode, a light emitting structure including a first semiconductor layer on the first electrode, an active layer on the first semiconductor layer and a second semiconductor layer on the active layer, a second electrode on the second semiconductor layer, a body on the second semiconductor layer, source and drain regions on the body, a gate insulating layer on the body between the source and drain regions, and a gate electrode on the gate insulating layer, wherein the second electrode is electrically connected to one of the source region and the drain region.

According to the embodiment, the light emitting device package may include a package body, a light emitting device on the package body, and a molding member surrounding the light emitting device, wherein the light emitting device includes a first electrode, a light emitting structure including a first semiconductor layer, an active layer and a second semiconductor layer on the first electrode, a second electrode on the light emitting structure, and a control switch on the light emitting structure to control the light emitting structure.

DETAILED DESCRIPTION OF THE EMBODIMENTS

Figure 1:
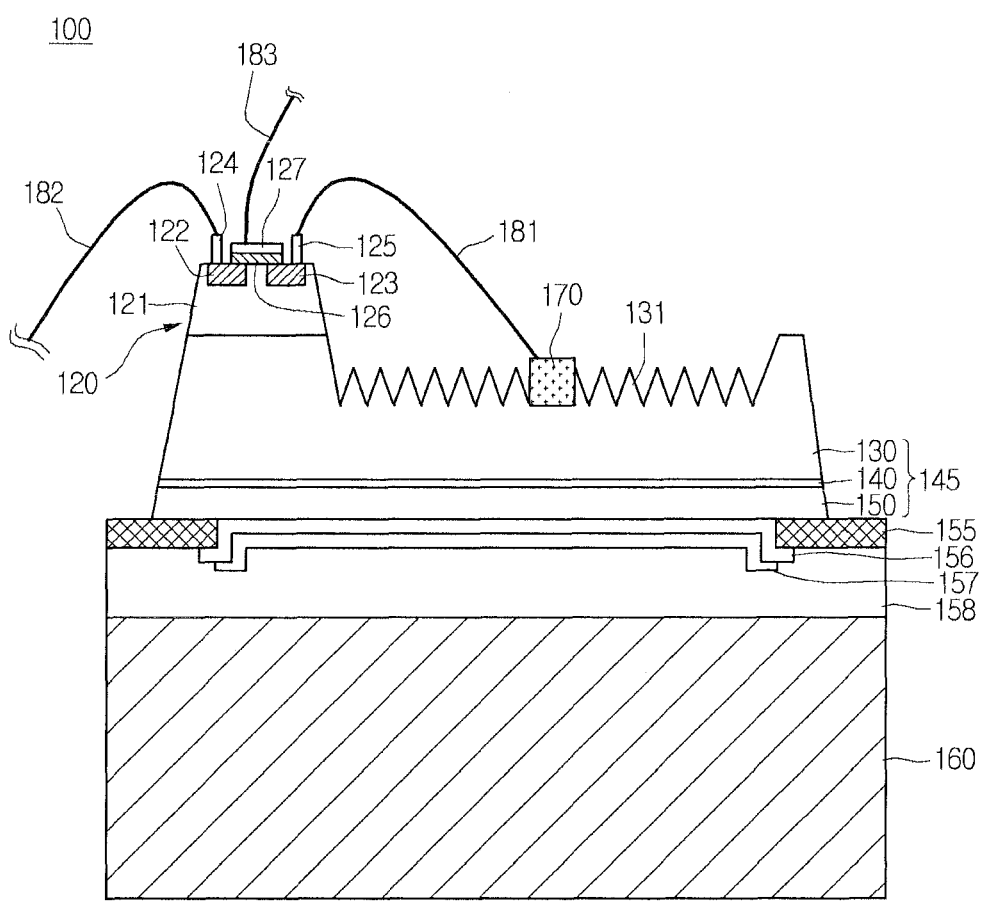
FIG. 1 is a sectional view of a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
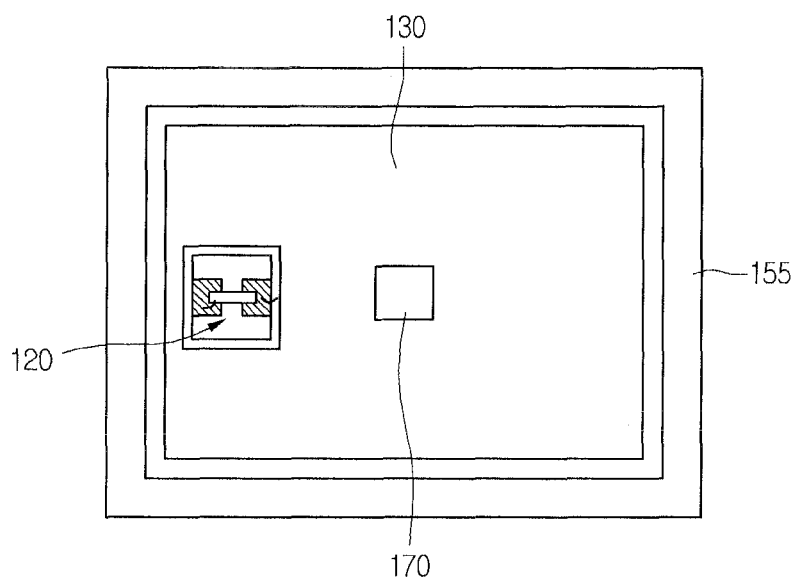
FIG. 2 is a plan view of a light emitting device.

FIG. 1 is a sectional view of a light emitting device according to the first embodiment, and FIG. 2 is a plan view of the light emitting device.

Referring to FIGS. 1 and 2, the light emitting device 100 according to the embodiment includes a first electrode 160, an adhesive layer 158 on the first electrode 160, a protective member 155 on the first electrode 160 or on an outer peripheral region of a top surface of the adhesive layer 158, a reflective layer 157 on the adhesive layer 158, an ohmic contact layer 156 on the reflective layer 157, a light emitting structure 145 on the protective member 155 and the ohmic contact layer 156, a second electrode 170 on the light emitting structure 145, and a control switch 120.

The first electrode 160 supports a plurality of layers formed thereon and has a function of an electrode. In detail, the first electrode 160 may include a support member having conductivity. The first electrode 160, together with the second electrode 170, supplies power to the light emitting structure 145.

For instance, the first electrode 160 may include at least one of Ti, Cr, Ni, Al, Pt, Au, W, Cu, Mo, Cu—W and a carrier wafer including Si, Ge, GaAs, ZnO, SiC, SiGe, or GaN.

The first electrode 160 can be plated and/or deposited below the light emitting structure 145 or can be attached in the form of a sheet, but the embodiment is not limited thereto.

The adhesive layer 158 may be formed on the first electrode 160. The adhesive layer 158 is a bonding layer formed under the reflective layer 157. Outer side surfaces of the adhesive layer 158 are exposed and the adhesive layer 158 makes contact with the reflective layer 157 to serve as a mediator for reinforcing the bonding strength between the first electrode 160 and the reflective layer 157.

The adhesive layer 158 may include a barrier metal or a bonding metal. For instance, the adhesive layer 158 may include at least one selected from the group consisting of Ti, Au, Sn, Ni, Cr, Ga, In, Bi, Cu, Ag and Ta.

If the first electrode 160 is formed through the plating scheme or the deposition scheme, other than the bonding scheme, the adhesive layer 158 may be omitted.

The protective member 155 is formed on the outer peripheral region of the top surface of the reflective layer 157. In detail, the protective member 155 is formed at the outer peripheral region among the light emitting structure 145, the ohmic contact and the adhesive layer 170.

The protective member 155 may include a material having electric insulating property or electric conductivity lower than that of the light emitting structure 145. For instance, the protective member 155 may include at least one selected from the group consisting of $SiO_2$, $Si_xO_y$, $Si_3N_4$, $Si_xN_y$, $SiO_xN_y$, $Al_2O_3$ and $TiO_2$. In this case, the protective member 155 may prevent the electric short from occurring between the light emitting structure 145 and the first electrode 160, thereby improving the reliability of the light emitting device 100.

The protective member 155 may include a metal having superior adhesive property. For instance, the protective member 155 may include at least one selected from the group consisting of Ti, Ni, Pt, Pd, Rh, Ir and W. In this case, the protective member 155 may reinforce the adhesive strength between the light emitting structure 145 and the reflective layer 157, so that the reliability of the light emitting device 100 can be improved. In addition, the protective member 155 may not be broken or fragments of the protective member 155 may not be generated when the laser scribing process or the laser lift off (LLO) process is performed to break a plurality of chips into individual chip units, so that the reliability of the light emitting device 100 can be improved. In addition, if the protective member 155 makes ohmic-contact with the first conductive semiconductor layer 150, the current may flow through the protective member 155. In this case, the active layer 140, which overlaps on the protective member 155 in the vertical direction, can generate the light, so that the light emitting efficiency of the light emitting device 100 may be further improved. For instance, if the first conductive semiconductor layer 150 is a p type semiconductor layer, the protective member 155 may include a metallic material, such as Ti, Ni or W, capable of forming the ohmic contact with respect to the p type semiconductor layer, but the embodiment is not limited thereto.

The protective member 155 may be formed on the outer peripheral region of the top surface of the adhesive layer 158. The protective member 155 prevents the electric short between the light emitting structure 145 and the first electrode.

The protective member 155 may include a material having electric insulating property. For instance, the protective member 155 may include at least one selected from the group consisting of $SiO_2$, $Si_xO_y$, $Si_3N_4$, $Si_xN_y$, $SiO_xN_y$, $Al_2O_3$, $TiO_2$, ITO, AZO, and ZnO.

The reflective layer 157 may be formed on the adhesive layer 158. The reflective layer 157 reflects light incident from the light emitting structure 145, thereby improving the light extraction efficiency of the light emitting device 100.

The reflective layer 157 may include a material having superior reflective property. For instance, the reflective layer 157 may include a metal or an alloy including at least one of Ag, Al, Pt, Pd and Cu.

For instance, the reflective layer 157 may include a metal or a metal alloy including at least one selected from the group consisting of Ag, Ni, Al, Rh, Pd, Ir, Ru, Mg, Zn, Pt, Au, and Hf, but the embodiment is not limited thereto. In addition, the reflective layer 157 can be prepared as a multi-layer by using the above metal and transparent conductive materials including one selected from the group consisting of IZO (In—ZnO), GZO (Ga—ZnO), AZO (Al—ZnO), AGZO (Al—Ga—ZnO), IGZO (In—Ga—ZnO) IZTO (indium zinc tin oxide), IAZO (indium aluminum zinc oxide), IGTO (indium gallium tin oxide) and ATO (aluminum tin oxide). For example, the reflective layer 157 has the multi-layer structure including one of IZO/Ni, AZO/Ag, IZO/Ag/Ni and AZO/Ag/Ni.

The ohmic contact layer 156 may be formed on the reflective layer 157. The ohmic contact layer 156 makes ohmic-contact with the first conductive semiconductor layer 150 of the light emitting structure 145 to easily supply power to the light emitting structure 145.

In detail, the ohmic contact layer 156 selectively includes the transparent conductive material and the metal. For instance, the ohmic contact layer 156 can be prepared as a single layer or a multiple layer by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au and Ni/IrOx/Au/ITO.

If the reflective layer 157 makes ohmic-contact with the light emitting structure 145, the ohmic layer 156 may be omitted.

The light emitting structure 145 may be formed on the ohmic contact layer 156 and the protective member 155. The light emitting structure 145 may include a plurality of group III-V compound semiconductor materials.

The light emitting structure 145 may include the first conductive semiconductor layer 150, the active layer 140 on the first conductive semiconductor layer 150, and the second conductive semiconductor layer 130 on the active layer 140.

The first conductive semiconductor layer 150 can be formed on a portion of the protective member 155 and on the ohmic contact layer 156. The first conductive semiconductor layer 150 may be a p type semiconductor layer including p type dopant. The p type semiconductor layer may include the group III-V compound semiconductor materials selected from the group consisting of GaN, AlN, AlGaN, InGaN, InN, InAlGaN, AlInN, AlGaAs, GaP, GaAs, GaAsP and AlGaInP. The p type dopant may include Mg, Zn, Ga, Sr or Ba. The first conductive semiconductor layer 150 can be prepared as a single layer or a multi-layer, but the embodiment is not limited thereto.

The first conductive semiconductor layer 150 supplies a plurality of carriers to the active layer 140.

The active layer 140 may include one of a single quantum well structure, a multiple quantum well (MQW) structure, a quantum wire structure and a quantum dot structure, but the embodiment is not limited thereto.

Electrons (or holes) injected through the second conductive semiconductor layer 130 are recombined with holes (or electrons) injected through the first conductive semiconductor layer 150 at the active layer 140, so that the active layer 140 emits the light based on the band gap difference of the energy band determined according to the intrinsic material of the active layer 140.

If the active layer 140 has the quantum well structure, the active layer 140 may have the single well structure or the multiple well structure including a well layer having the compositional formula of $In_xAl_yGa_{1-x-y}N$ ($0 \leq x \leq 1$, $0 \leq y \leq 1$, $0 \leq x+y \leq 1$) and a barrier layer having the compositional formula of $In_aAl_bGa_{1-a-b}N$ ($0 \leq a \leq 1$, $0 \leq b \leq 1$, $0 \leq a+b \leq 1$). In addition, the well layer may include a material having an energy band gap lower than that of the barrier layer.

The active layer 140 may have a stack structure of well/barrier layers by using the group III-V compound semiconductor materials. The group III-V compound semiconductor materials used for the active layer 140 may include GaN, InGaN, or AlGaN. Therefore, for instance, the active layer 140 may be prepared as a stack structure of InGaN well/GaN barrier layers, InGaN well/AlGaN barrier layers, or InGaN well/InGaN barrier layers, but the embodiment is not limited thereto.

Although not shown in the drawings, a conductive clad layer can be formed on and/or under the active layer 140. The conductive clad layer may include an AlGaN-based semiconductor. For instance, a p type clad layer including p type dopant may be formed between the first conductive semiconductor layer 150 and the active layer 140, and an n type clad layer including n type dopant may be formed between the second conductive semiconductor layer 130 and the active layer 140.

The conductive clad layer serves as a guide for preventing holes and electrons injected into the active layer 140 from migrating to the first and second conductive semiconductor layers 150 and 130. Thus, a larger amount of holes and electrons are recombined in the active layer 140 due to the conductive clad layer, so that the light emitting efficiency of the light emitting device 100 can be improved.

The second conductive semiconductor layer 130 can be formed on the active layer 140. The second conductive semiconductor layer 130 may be an n type semiconductor layer including n type dopant. The second conductive semiconductor layer 130 may include the group III-V compound semiconductor materials selected from the group consisting of GaN, AlN, AlGaN, InGaN, InN, InAlGaN, AlInN, AlGaAs, GaP, GaAs, GaAsP and AlGaInP. The n type dopant may include Si, Ge, Sn, Se or Te. The second conductive semiconductor layer 130 can be prepared as a single layer or a multiple layer, but the embodiment is not limited thereto.

A roughness or a concave-convex pattern 131 can be formed on the top surface of the second conductive semiconductor layer 130 to improve the light extraction efficiency. The roughness or the concave-convex pattern 131 may be randomly formed through the wet etching or regularly formed through the patterning process, such as the photonic crystal structure, but the embodiment is not limited thereto.

The roughness or the concave-convex pattern 131 may have periodic patterns. Concave patterns and convex patterns of the roughness or the concave-convex pattern 131 may be rounded or formed with lateral surfaces inclined at a predetermined angle to meet to each other at the vertex thereof.

For instance, the roughness or the concave-convex pattern 131 may have the photonic crystal structure capable of selectively transmitting or reflecting the light having a specific wavelength. The roughness or the concave-convex pattern 131 may have the period of 50 nm to 3000 nm, but the embodiment is not limited thereto.

Meanwhile, a semiconductor layer having a polarity opposite to that of the first conductive semiconductor layer 150 may be formed under the first conductive semiconductor layer 150. If the first conductive semiconductor layer 150 is a p type semiconductor layer, the second conductive semiconductor layer 130 is an n type semiconductor layer, or vice versa. Thus, the light emitting structure 145 may include at least one of N—P junction, P—N junction, N—P—N junction and P—N—P junction structures.

The second conductive semiconductor layer 130 may include only the n type semiconductor layer or may further include an undoped semiconductor layer on then type semiconductor layer, but the embodiment is not limited thereto.

The undoped semiconductor layer is not doped with conductive dopant, so the undoped semiconductor layer has electric conductivity remarkably lower than that of the n type semiconductor layer or the second conductive semiconductor layer 130. The undoped semiconductor layer is grown to improve crystalline property of the second conductive semiconductor layer 130.

The doping concentration of the conductive dopant in the first and second conductive semiconductor layers 150 and 130 may be uniform or non-uniform. That is, the light emitting structure 145 may have various structures, and the embodiment may not limit the structure of the light emitting structure 145.

The second electrode 170 and the control switch 120 may be formed on the second conductive semiconductor layer 130.

The second electrode 170 can supply power to the light emitting structure 100 together with the first electrode 160. For instance, the second electrode 170 can be prepared as a single layer or a multi-layer by using at least one selected from the group consisting of Ti, Cr, Ni, Al, Pt, Au, W, Cu, and Mo, but the embodiment is not limited thereto. The second electrode 170 may be formed through the deposition or plating process.

The control switch 120 is formed on the second conductive semiconductor layer 130. Preferably, the control switch 120 is formed on an outer peripheral region of the second conductive semiconductor layer 150 to minimize absorption of the light emitted from the light emitting structure 145.

The control switch 120 controls the on/off operation of the light emitting device 100 according to the external control signal.

In detail, the on/off operation of the light emitting device 100 can be controlled by the control switch 120 according to the external control signal, so the number of driver IC chips for driving the light emitting device 100 can be reduced and the on/off operation of the light emitting device 100 can be precisely controlled by using a simple wire interconnection.

The control switch 120 can be formed on the top surface of the second conductive semiconductor layer 130 of the light emitting structure 145 through a simple process. The control switch 120 can be formed with a fine size by doping silicon in the semiconductor manufacturing process, so the control switch 120 may not degrade the light emitting efficiency of the light emitting device 100.

The control switch 120 may include a body 121 made from a silicon material and doped with p type dopant, source and drain regions 122 and 123 formed by implanting n type dopant onto an upper portion of the body 121, a gate insulating layer 126 formed on the body 121 and the source and drain regions 122 and 123, a gate electrode 127 on the gate insulating layer 126, a source electrode 124 on the source region 122, and a drain electrode 125 on the drain region 123.

In detail, the control switch 120 is a MOSFET switch, which controls the on/off operation and the brightness of the light emitting device 100 according to the control signal applied to the gate electrode 127.

Although the control switch 120 according to the embodiment includes the MOSFET switch, the embodiment may not limit the type of the control switch 120. For instance, semiconductor switches, such as a JFET switch, a CMOS switch, or a BJT switch, can be used for the control switch 120.

The protective member 155 vertically overlaps with the body 121. The body 121 is made from a silicon material. In detail, the body 121 can be simply formed by selectively removing a silicon substrate through an etching process. That is, the body 121 of the control switch 120 can be formed by selectively removing the silicon substrate used for growing and supporting the light emitting structure 145, so that the manufacturing process can be simplified and the process efficiency can be improved.

The body 121 is doped with p type dopant, so the body 121 may form a p type semiconductor. The p type dopant, for instance, may include at least one of Mg, Be and B.

The source region 122 and the drain region 123 are formed on the body 121. The source region 122 and the drain region 123 can be formed by doping on an upper portion of the body 121 with n type dopant. The n type dopant, for instance, may include at least one of N, P, As, or Sb.

In the meantime, if the first conductive semiconductor layer 150 is an n type semiconductor layer and the second conductive semiconductor layer 130 is an p type semiconductor layer, the n type dopant is implanted into the body 121 and the p type dopant is implanted into the source region 122 and the drain region 123.

The gate insulating layer 126 is formed on the top surfaces of the body 121, the source region 122 and the drain region 123, and the gate electrode 127 is formed on the gate insulating layer 126.

The control signal is applied to the gate electrode 127 and the gate insulating layer 126 insulates the gate electrode 127 from the body 121, the source region 122 and the drain region 123.

For instance, the gate electrode 127 may include at least one selected from the group consisting of Al, Cr, Ni, Ti, Cu, Pt, Ag, Pd, Rh and Au. In addition, the gate insulating layer 126 may include at least one selected from the group consisting of $SiO_2$, $HfO_x$, $Al_2O_3$, $Si_3N_4$ and $TiO_x$.

The thickness of the gate insulating layer 126 can be controlled such that a channel can be formed between the source region 122 and the drain region 123 as the control signal is applied to the gate electrode 127. The on/off operation of the light emitting device 100 is controlled according to the current flowing through the channel.

The source electrode 124 and the drain electrode 125 make contact with the source region 122 and the drain region 123, respectively. For instance, the source electrode 124 and the drain electrode 125 may include at least one selected from the group consisting of Al, Cr, Ni, Ti, Cu, Pt, Ag, Pd, Rh and Au.

In order to allow the control switch 120 to serve as a switch, one of the source electrode 124 and the drain electrode 125 is electrically connected to the second electrode 170 formed on the light emitting structure 145 through a first wire 181 and the other of the source electrode 124 and the drain electrode 125 is connected to the external power source through a second wire 182. In addition, another external power source can be connected to the gate electrode 127 through a third wire 183 to supply the control signal.

Figure 3:
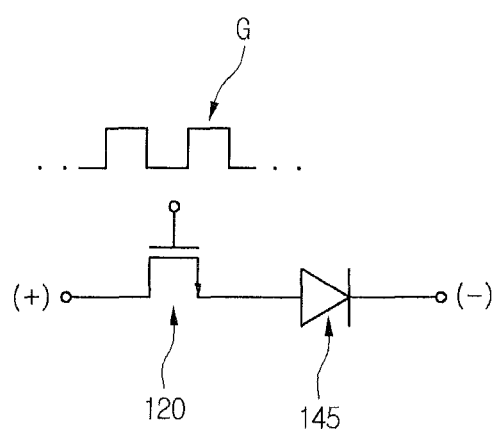
FIG. 3 is a circuit view showing an operational principle of a light emitting device of FIG. 1.

Hereinafter, the operation principle of the light emitting device according to the first embodiment will be described in detail. FIG. 3 is a circuit view showing the operational principle of the light emitting device according to the first embodiment.

Referring to FIG. 3, the control switch 120 is connected to the light emitting structure 145 in series. The control switch 120 may include a semiconductor switch, such as a JFET switch, a CMOS switch, or a BJT switch, which controls the light emitting structure 145 according to the control signal G applied to the gate electrode 127.

The control signal G may be a high/low (or, on/off) control signal for simply controlling the on/off operation of the light emitting device 100, or a gray-scale control signal for controlling the brightness as well as the on/off operation of the light emitting device 100, but the embodiment is not limited thereto.

If the control signal is the on/off control signal, the control switch 120 is turned on by the on/off control signal, so that the supply of a negative voltage or a positive voltage to the second conductive semiconductor layer 130 of the light emitting structure 145 by way of the source electrode 124, the channel layer, the drain electrode 125 and the second electrode 170 can be controlled. Since the negative voltage or the positive voltage is supplied to the first electrode 160, the light emitting structure 145 may emit the light based on the negative voltage or the positive voltage supplied to the first and second electrodes 160 and 170.

If the control signal is the gray-scale control signal, the turn-on time and the frequency of the turn-on operation of the control switch 120 are controlled by the gray-scale control signal. Thus, the light emitting structure 145 emits the light in the form of a pulse to express the gray scale. The gray scale can be various expressed, and the embodiment is not limited thereto.

Since the current flows through the channel formed between the source region 122 and the drain region 123 of the control switch 120 as the control signal G is applied to the control switch 120, the on/off operation and/or the brightness of the light emitting device 100 can be controlled.

For instance, if the control signal G is a high signal, the current flows through the channel formed in the control switch 120, so that the control switch 120 is turned on, and thus, the light emitting device 100 is turned on. That is, the voltage is supplied to the light emitting structure 145 so that the light emitting structure 145 can emit the light. In contrast, if the control signal G is a low signal, the current may not flow through the channel formed in the control switch 120, so that the control switch 120 is turned off, and thus, the light emitting device 100 is turned off. That is, the voltage is not supplied to the light emitting structure 145.

As described above, since the control switch 120 is formed on the light emitting structure 145 through the simple process with high efficiency, the on/off operation and/or the brightness of the light emitting device 100 can be effectively controlled.

Hereinafter, the method of manufacturing the light emitting device according to the first embodiment will be described in detail.

FIGS. 4 to 12 are sectional views showing the method of manufacturing the light emitting device according to the first embodiment.

Figure 4:
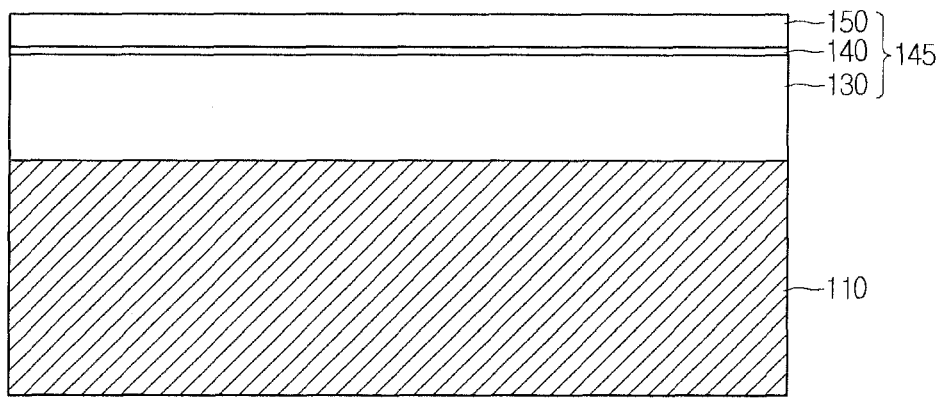
FIGS. 4 to 12 are sectional views showing a method of manufacturing the light emitting device according to the first embodiment.

Referring to FIG. 4, the light emitting structure 145 is formed on the silicon substrate 110. The light emitting structure 145 can be formed by sequentially depositing the second conductive semiconductor layer 130, the active layer 140, and the first conductive semiconductor layer 150 on the silicon substrate 110.

The silicon substrate 110 may include silicon. The silicon is inexpensive and easily processed as compared with a sapphire substrate.

The light emitting structure 145 can be formed on the silicon substrate 110 through MOCVD (metal organic chemical vapor deposition), CVD (chemical vapor deposition), PECVD (plasma-enhanced chemical vapor deposition), MBE (molecular beam epitaxy), or HVPE (hydride vapor phase epitaxy), but the embodiment is not limited thereto.

A buffer layer (not shown) can be formed between the second conductive semiconductor layer 130 and the silicon substrate 110 to attenuate the lattice mismatch and difference of the thermal explanation coefficient between the second conductive semiconductor layer 130 and the silicon substrate 110. For instance, the buffer layer can be prepared as a single layer or a multi-layer by using a semiconductor material having the compositional formula of $In_xAl_yGa_{1-x-y}N$ ($0 \leq x \leq 1$, $0 \leq y \leq 1$, $0 \leq x+y \leq 1$).

Figure 5:
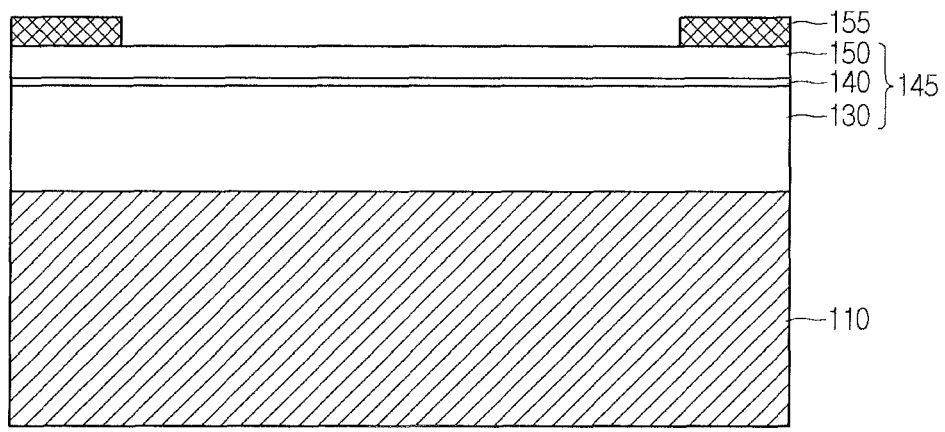

Referring to FIG. 5, the protective member 155 may include a material having electric insulating property or electric conductivity lower than that of the light emitting structure 145. For instance, the protective member 155 may include at least one selected from the group consisting of $SiO_2$, $Si_xO_y$, $Si_3N_4$, $Si_xN_y$, $SiO_xN_y$, $Al_2O_3$ and $TiO_2$. In this case, the protective member 155 may prevent the electric short from occurring between the light emitting structure 145 and the first electrode 160, thereby improving the reliability of the light emitting device 100.

In addition, the protective member 155 may include a metal having superior adhesive property. For instance, the protective member 155 may include at least one selected from the group consisting of Ti, Ni, Pt, Pd, Rh, Ir and W. In this case, the protective member 155 may reinforce the adhesive strength between the light emitting structure 145 and the reflective layer 157, so that the reliability of the light emitting device 100 can be improved. In addition, the protective member 155 may not be broken or fragments of the protective member 155 may not be generated when the laser scribing process or the laser lift off (LLO) process is performed to break a plurality of chips into individual chip units, so that the reliability of the light emitting device 100 can be improved. In addition, if the protective member 155 makes ohmic-contort with the first conductive semiconductor layer 150, the current may flow through the protective member 155. In this case, the active layer 140, which overlaps on the protective member 155 in the vertical direction, can generate the light, so that the light emitting efficiency of the light emitting device 100 may be further improved. For instance, if the first conductive semiconductor layer 150 is a p type semiconductor layer, the protective member 155 may include a metallic material, such as Ti, Ni or W, capable of forming the ohmic contact with respect to the p type semiconductor layer, but the embodiment is not limited thereto.

The protective member 155 can be formed through the deposition process, such as sputtering or PECVD, but the embodiment is not limited thereto.

Figure 6:
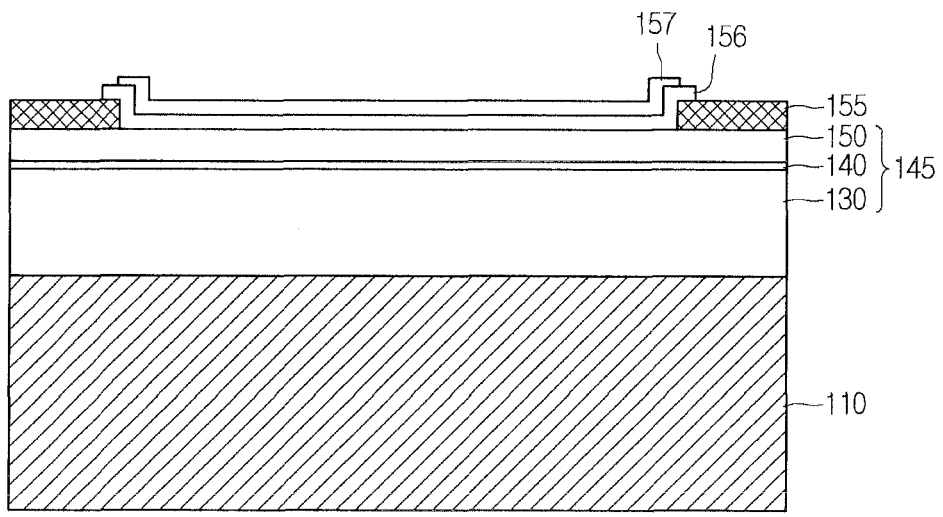

Referring to FIG. 6, the ohmic contact layer 156 is formed on the light emitting structure 145 and the reflective layer 157 is formed on the ohmic contact layer 156. The ohmic contact layer 156 and the reflective layer 157 can be formed through the deposition process, such as sputtering, PECVD, or E-beam evaporation.

The ohmic contact layer 156 may include at least one of ITO, Ni, Pt, Ir, Rh, and Ag. In addition, the reflective layer 157 may include a metal or an alloy including at least one of Ag, Al, Pt, Pd, and Cu.

Figure 7:
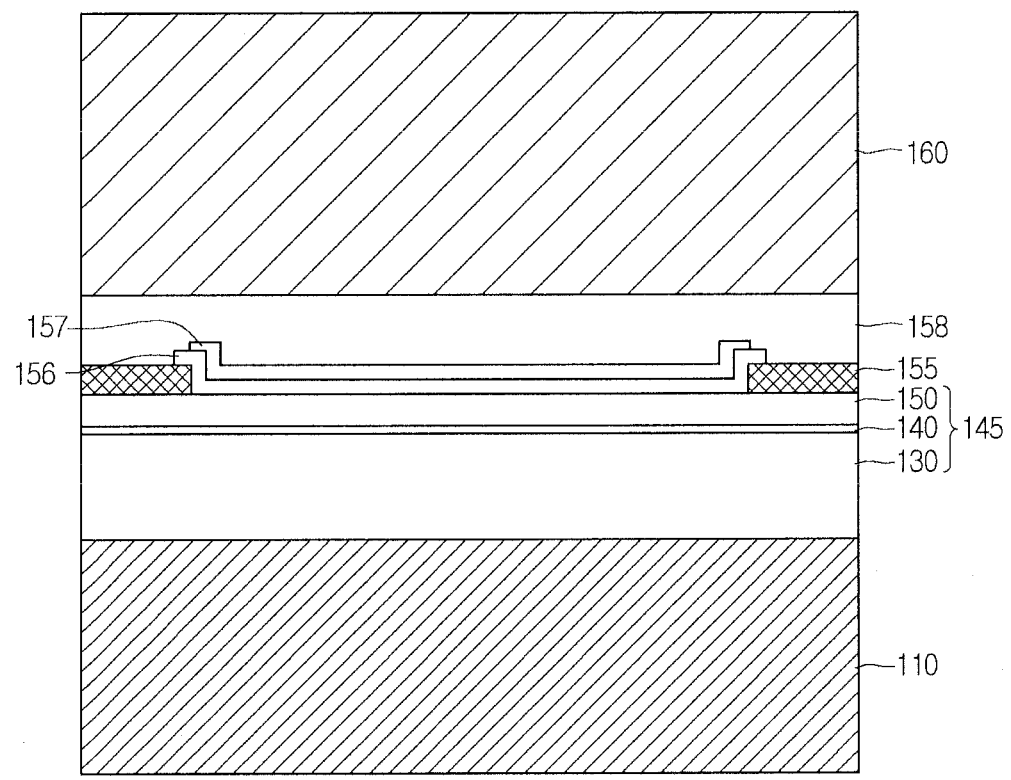

Referring to FIG. 7, the adhesive layer 158 is formed on the reflective layer 157 and the protective member 155, and the first electrode 160 is formed on the adhesive layer 158. The first electrode 160 may include the support member having conductivity.

The adhesive layer 158 may improve the interfacial adhesive strength between the first electrode 160 and the light emitting structure 145. For instance, the adhesive layer 158 may include at least one selected from the group consisting of Ti, Au, Sn, Ni, Cr, Ga, In, Bi, Cu, Ag and Ta.

The first electrode 160 is prepared as a sheet and bonded onto the top surface of the adhesive layer 158. Otherwise, the first electrode 160 can be formed through the plating process or the deposition process. In this case, the adhesive layer 158 may be omitted.

For instance, the first electrode 160 may include at least one of Ti, Cr, Ni, Al, Pt, Au, W, Cu, Mo, and a semiconductor substrate doped with impurities.

Figure 8:
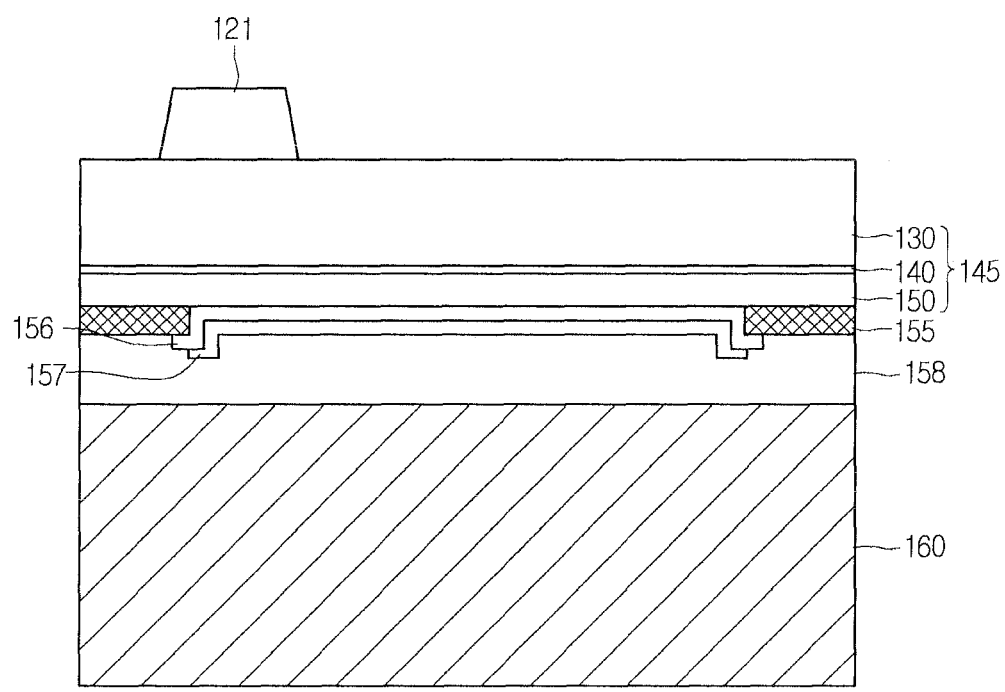

Referring to FIG. 8, the body 121 of the control switch 120 is formed by selectively removing the silicon substrate 110. Preferably, the body 120 is formed on the outer peripheral region of the bottom surface of the light emitting structure 145, but the embodiment is not limited thereto.

In detail, the silicon substrate 110 is selectively etched to form the body 121. As shown in FIG. 8, the body 121 may have a polygonal column shape, but the embodiment may not limit the shape and the manufacturing process for the body 121.

After that, the p type dopant is implanted into the body 121, so that the p type semiconductor layer is formed. The p type dopant may be implanted into the silicon substrate 110 shown in FIG. 4 before the light emitting structure 145 is formed. In other words, the p type dopant may be implanted into the silicon substrate 110 before the light emitting structure 145 is formed or implanted into the body 121 after the body 121 has been formed.

Since the silicon substrate 110 can be easily removed through the etching process, the LLO (laser lift off) process, which may reduce the product yield of the light emitting device, can be omitted, so that the reliability of the manufacturing process for the light emitting device 100 can be improved.

Meanwhile, the sapphire substrate can be employed as a base substrate of the light emitting structure 145 instead of the silicon substrate. In this case, the sapphire substrate is selectively removed through the LLO process and the body is formed 121 on the light emitting structure 145 through the deposition process, but the embodiment is not limited thereto.

Figure 9:
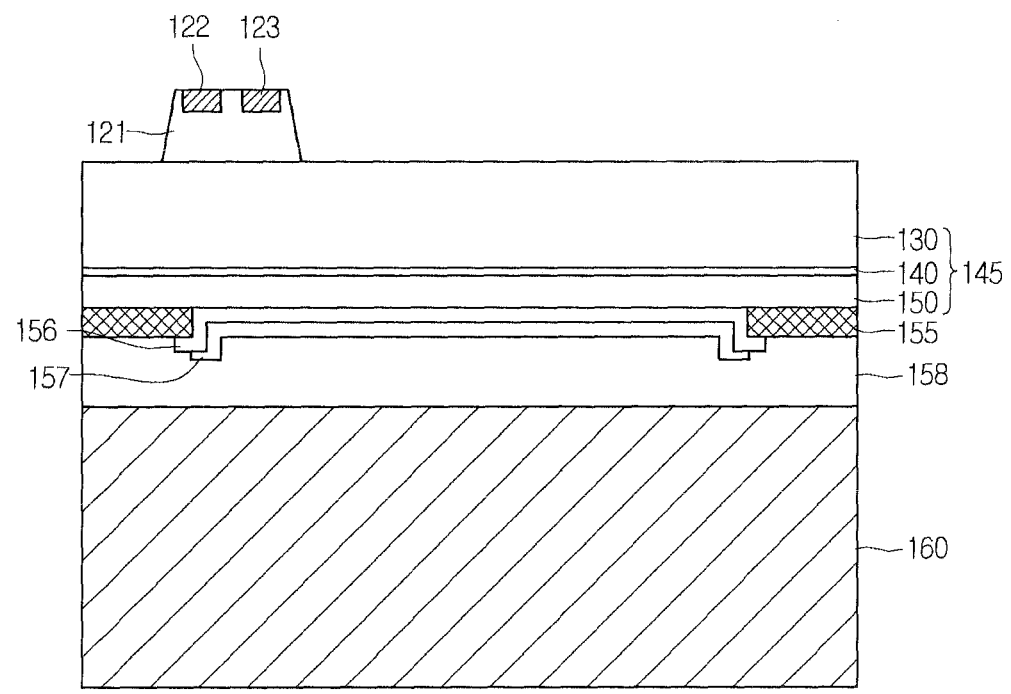

Referring to FIG. 9, the n type dopant is selectively implanted into the lower portion of the body 121 to form the source region 122 and the drain region 123.

In order to form the source region 122 and the drain region 123 in desired position, the mask pattern is formed in the body 121 and the n type dopant is implanted along the mask pattern through the ion implantation or the thermal diffusion, but the embodiment is not limited thereto.

Figure 10:
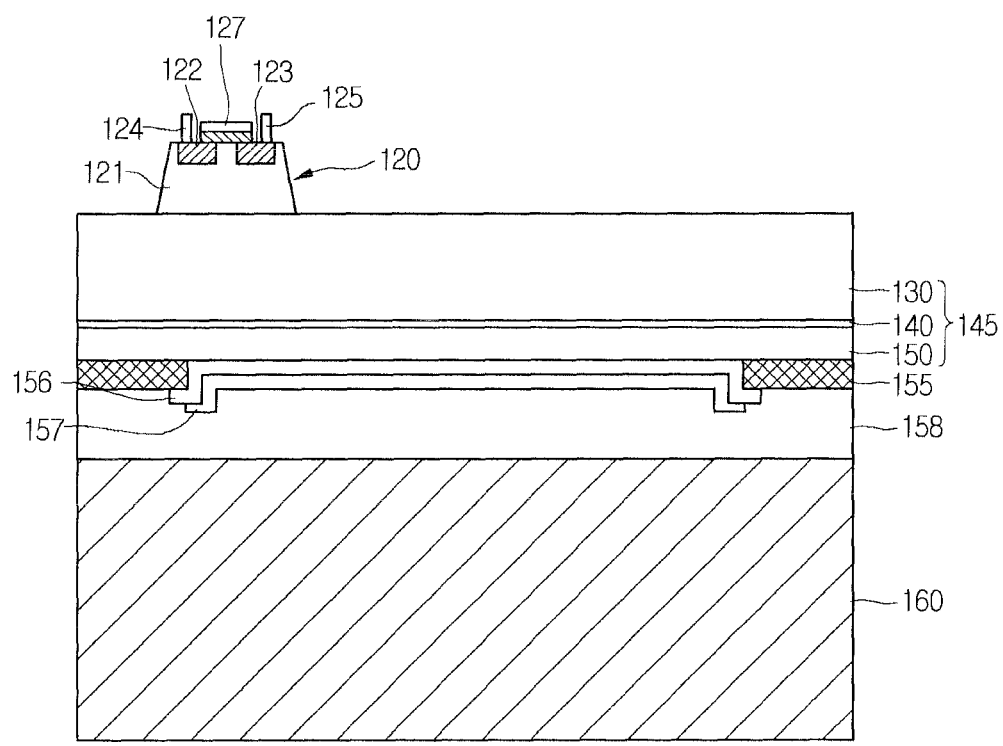

Referring to FIG. 10, the gate insulating layer 126 is formed such that the gate insulating layer 126 makes contact with the body 121, the source region 122 and the drain region 123, and the gate electrode 127 is formed on the gate insulating layer 126. In addition, the source electrode 124 is formed on the source region and the drain electrode 125 is formed on the drain region 123, thereby forming the control switch 120.

For instance, the gate insulating layer 126 is deposited through CVD (chemical vapor deposition) or ALD (atomic layer deposition).

In addition, the gate electrode 127, the source electrode 124 and the drain electrode 125 can be formed through the CVD, E-beam evaporation or sputtering, but the embodiment is not limited thereto.

Figure 11:
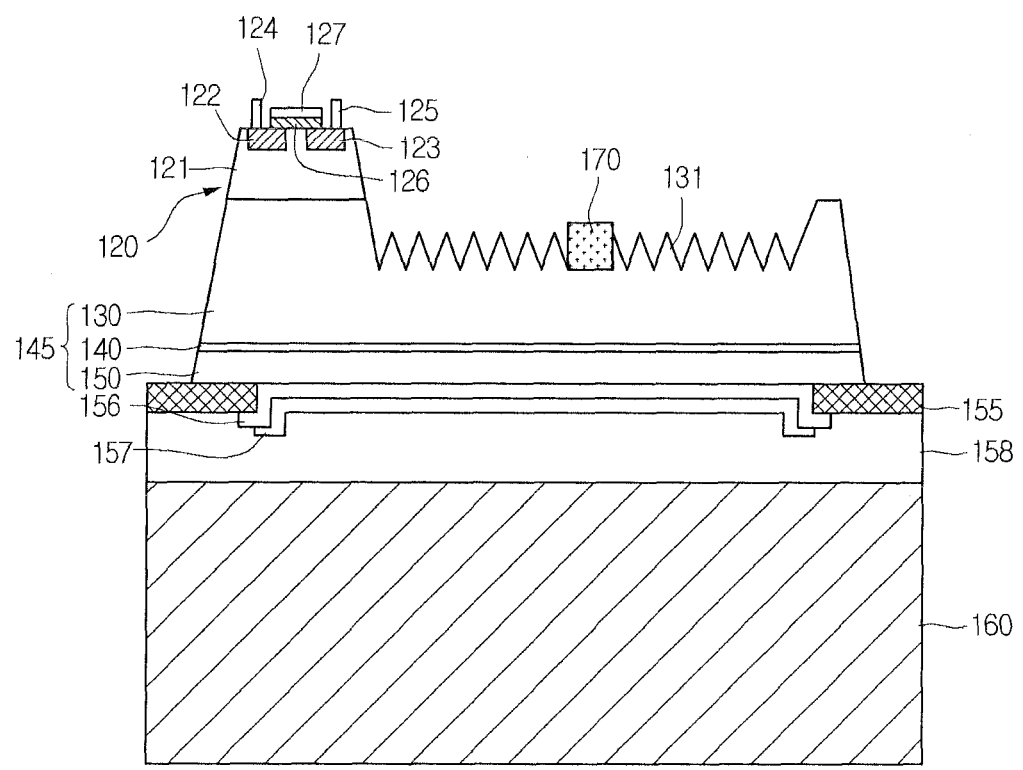

Referring to FIG. 11, the isolation etching is performed with respect to the light emitting structure 145 and the roughness or the concave-convex pattern 131 is formed on the top surface of the light emitting structure 145, that is, on the top surface of the second conductive semiconductor layer 130. In addition, the second electrode 170 is formed on the top surface of the second conductive semiconductor layer 130, thereby providing the light emitting device 100 according to the first embodiment.

The light emitting device chips can be divided into individual chip units through the isolation etching.

The lateral side of the light emitting structure 145 may be inclined through the isolation etching.

In addition, the roughness or the concave-convex pattern 131 can be formed on the top surface of the light emitting structure 145, that is, on the top surface of the second conductive semiconductor layer 130 through the isolation etching.

The isolation etching may include a dry etching, such as an ICP (inductively coupled plasma) etching.

The roughness or the concave-convex pattern 131 may be randomly formed through the wet etching or may have a photonic crystal structure along the mask pattern, but the embodiment is not limited thereto.

For instance, the second electrode 170 can be formed through the CVD, E-beam evaporation or sputtering.

Figure 12:
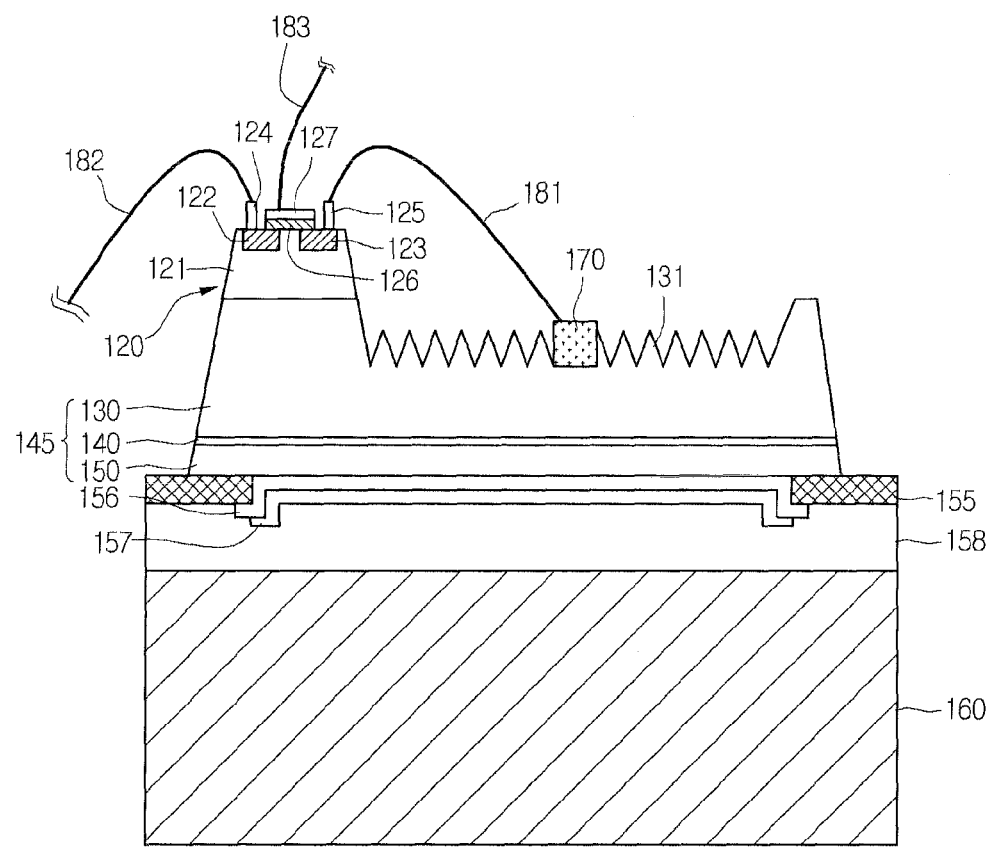

Referring to FIG. 12, a wire interconnection is formed to allow the control switch 120 to serve as a switch. Such a wire interconnection can be formed after the light emitting device 100 has been mounted on the substrate, but the embodiment is not limited thereto.

For instance, as shown in FIG. 11, one of the source electrode 124 and the drain electrode 125 is electrically connected to the second electrode 170 formed on the light emitting structure 145 through the first wire 181 and the other of the source electrode 124 and the drain electrode 125 is connected to the external power source by a second wire 182. In addition, another external power source can be connected to the gate electrode 127 through a third wire 183 to supply the control signal.

Hereinafter, the light emitting device and the method of manufacturing the same according to the second embodiment will be described in detail.

Figure 13:
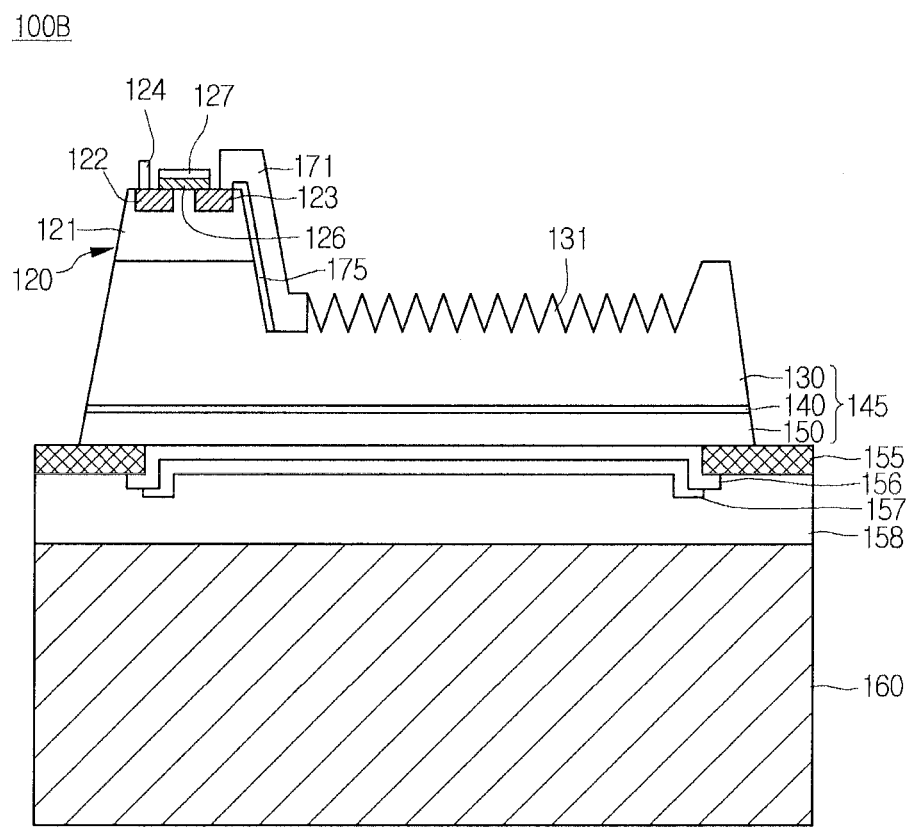
FIG. 13 is a sectional view of a light emitting device according to the second embodiment.

FIG. 13 is a sectional view of the light emitting device according to the second embodiment. The light emitting device 100B according to the second embodiment is similar to the light emitting device 100 according to the first embodiment except for the electrode structure. Thus, details of the elements and structures that have been previously described in the first embodiment will be omitted or simplified to avoid redundancy and the same reference numerals will be assigned to the same elements.

Referring to FIG. 13, the light emitting device 100B according to the second embodiment includes a first electrode 160, an adhesive layer 158 on the first electrode 160, a protective member 155 on the first electrode 160 or on an outer peripheral region of a top surface of the adhesive layer 158, a reflective layer 157 on the adhesive layer 158, an ohmic contact layer 156 on the reflective layer 157, a light emitting structure 145 on the protective member 155 and the ohmic contact layer 156, a control switch 120 on the light emitting structure 145, and a second electrode 171 formed on the control switch 120 and the light emitting structure 145 to electrically connect the control switch 120 to the light emitting structure 145.

The control switch 120 may include a body 121 made from a silicon material and doped with p type dopant, source and drain regions 122 and 123 formed by implanting n type dopant onto an upper portion of the body 121, a gate insulating layer 126 formed on the body 121 and the source and drain regions 122 and 123, a gate electrode 127 on the gate insulating layer 126, and a source electrode 124 formed on one of the source region 122 and the drain region 123.

The second electrode 171 is formed on the other of the source region 122 and the drain region 123 and electrically connected to the light emitting structure 145.

In this case, in order to prevent the second electrode 171 from being electrically connected to the body 121, an insulating layer 175 may be formed between the second electrode 171 and the lateral side of the body 121.

If the second electrode 171 is electrically connected to the body 121, malfunction of the control switch 120 may occur.

The insulating layer 175 may be formed on a lateral side and a portion of the top surface of the body 121 and on a portion of the top surface of the second conductive semiconductor layer 130 adjacent to the concave-convex pattern 131.

The insulating layer 175 may include at lest one selected from the group consisting of $SiO_2$, $Si_xO_y$, $Si_3N_4$, $Si_xN_y$, $SiO_xN_y$, $Al_2O_3$ and $TiO_2$.

The second electrode 171 can be electrically connected to one of the source and drain regions 122 and 123 and the second conductive semiconductor layer 130 of the light emitting structure.

The second electrode 171 electrically connected to the second conductive semiconductor layer 130 may extend from the second conductive semiconductor layer 130 so as to be electrically connected to one of the source and drain regions 122 and 123.

The second electrode 171 is formed on the insulating layer 175. One end of the second electrode 171 is electrically connected to the second conductive semiconductor layer 130 and the other end of the second electrode 171 is electrically connected to one of the source and drain regions 122 and 123.

The insulating layer 175 prevents the second electrode 171 from being electrically connected to the body 121 of the control switch 120, so that the malfunction of the control switch 120 may not occur.

That is, different from the first embodiment, in which wires are additionally provided to electrically connect one of the source and drain regions 122 and 123 to the light emitting structure 145, the wires can be omitted in the light emitting device 100B according to the second embodiment by forming the second electrode 171. Thus, the light may not interference with the wires.

Figure 14:
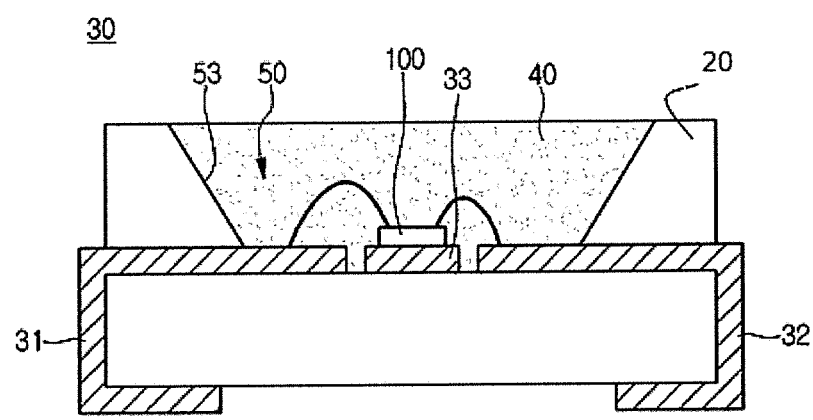
FIG. 14 is a sectional view showing a light emitting device package including a light emitting device according to the embodiment.

FIG. 14 is a sectional view showing a light emitting device package including the light emitting device according to the embodiments.

Referring to FIG. 14, the light emitting device package 30 includes a package body 20, first to third lead electrodes 31 to 33 formed on the package body 20, the light emitting device 100 provided on the package body 20 to receive power from the first and second lead electrodes 31 and 32 and the control signal from the third lead electrode 33, and a molding member 40 that surrounds the light emitting device 100.

The package body 20 may include silicon, synthetic resin or metallic material. When viewed from the top, the package body 20 has a cavity 50 formed with an inclined inner wall 53.

The first to third lead electrodes 31 to 33 are electrically isolated from each other. For instance, the power is supplied to the first and third lead electrodes 31 and 33 and the control signal is supplied to the second electrode 32.

The first and second lead electrodes 31 and 32 may extend by passing through the package body 20. In detail, one ends of the first and second lead electrodes 31 and 32 are disposed in the cavity 50 and the other ends of the first and second electrodes 31 and 32 are attached to an outer surface of the package body 20 and exposed to the outside.

The third lead electrode 33 is provided on the package body 20 between the first and second lead electrodes 31 and 32.

The first to third lead electrodes 31 to 33 are coated with reflective layers to reflect the light emitted from the light emitting device 100, thereby improving the light efficiency. Further, the first to third lead electrodes 31 to 33 dissipate heat generated from the light emitting device 100 to the outside.

The light emitting device 100 can be directly installed on the body 20 or one of the first to third lead electrodes 31 to 33. For instance, the first electrode 160 (see, FIG. 1) of the light emitting device is formed on the third lead electrode 33, the first lead electrode 31 is electrically connected to the source electrode 124 of the control switch 120 by the second wire 182 (see, FIG. 1), and the second lead electrode 32 is electrically connected to the gate electrode 127 of the control switch 120 by the third wire 183.

As described above, the drain electrode 125 of the control switch 120 is electrically connected to the second electrode 170 by the first electrode 181.

The molding member 40 surrounds the light emitting device 100 to protect the light emitting device 100. In addition, the molding member 40 may include phosphors to change the wavelength of the light emitted from the light emitting device 100.

Figure 15:
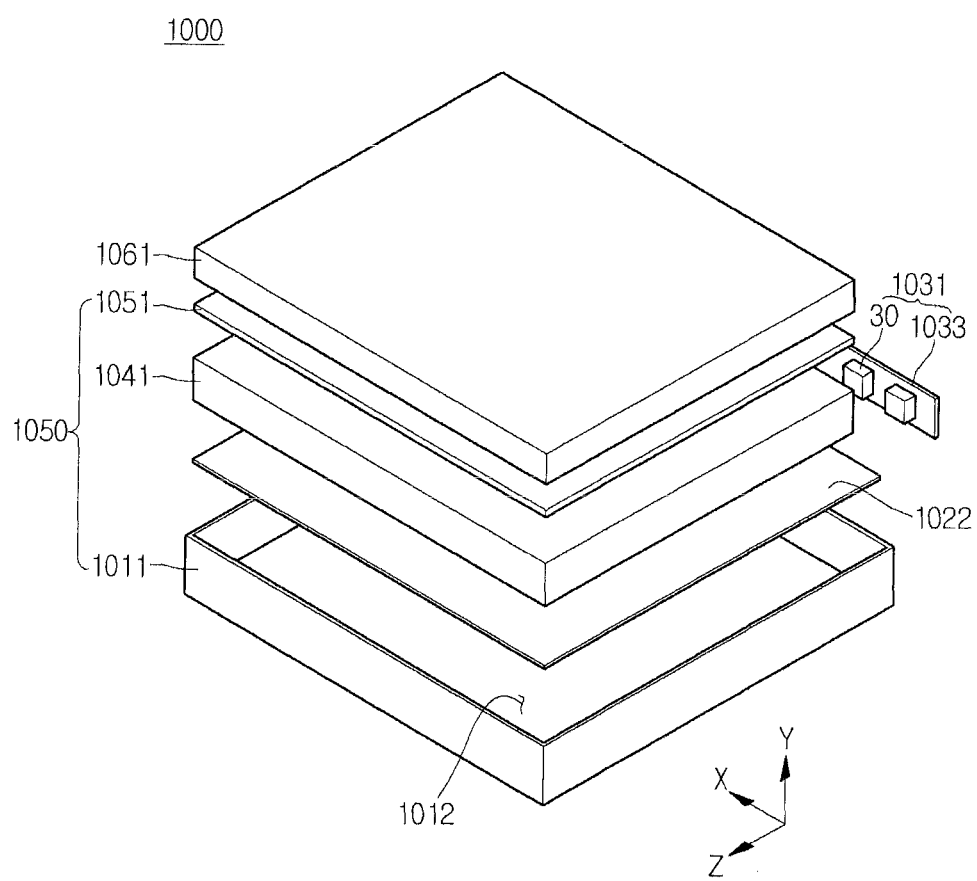
FIG. 15 is an electrode perspective view showing a display device according to the embodiment.
Figure 16:
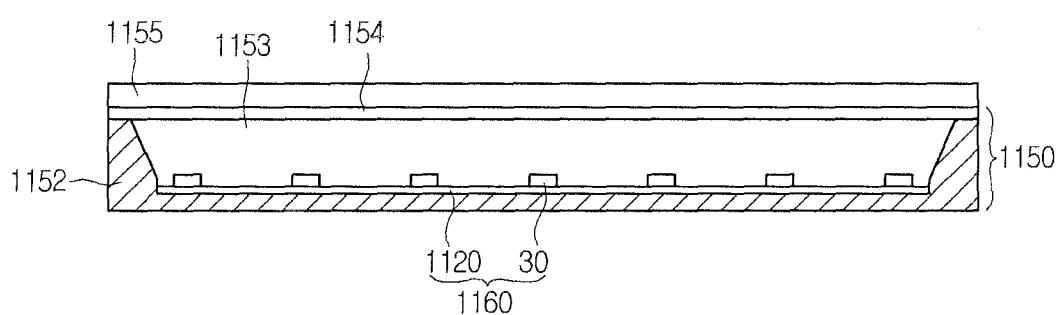
FIG. 16 is a sectional view showing a display device according to another embodiment.
Figure 17:
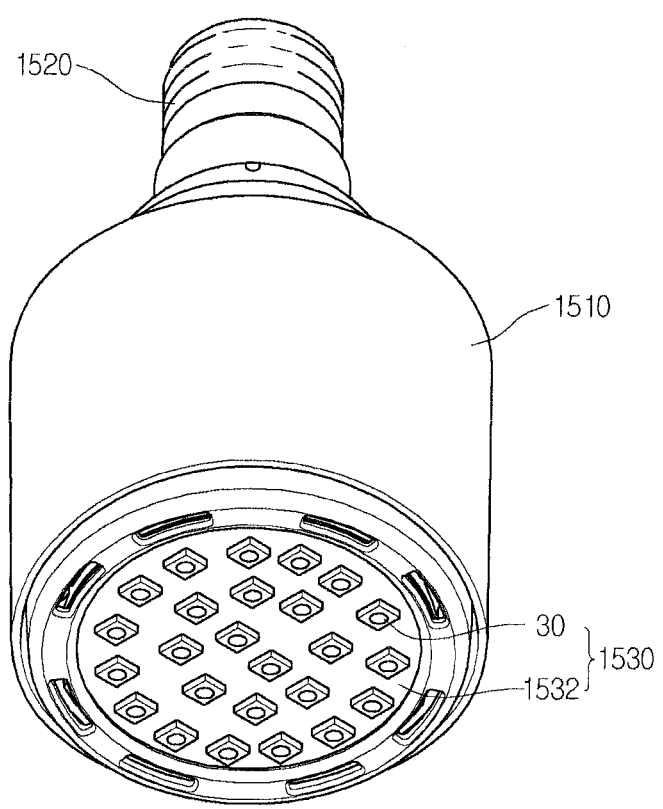
FIG. 17 is a perspective view showing a lighting device according to the embodiment.

The light emitting device or the light emitting device package according to the embodiment can be applied to the light unit. The light unit includes a plurality of light emitting devices or a plurality of light emitting device packages. The light unit may include the display device as shown in FIGS. 15 and 16 and the lighting device as shown in FIG. 17. In addition, the light unit may include a lighting lamp, a signal lamp, a headlight of a vehicle, and an electric signboard.

FIG. 15 is an exploded perspective view showing the display device according to the embodiment.

Referring to FIG. 15, the display device 1000 includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light supplied from the light emitting module 1031 to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval. The substrate 1033 may include a printed circuit board (PCB), but the embodiment is not limited thereto. In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially makes contact with the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is travelled downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 16 is a sectional view showing a display device according to the embodiment.

Referring to FIG. 16, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 17 is a perspective view showing a lighting device according to the embodiment.

Referring to FIG. 17, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits DV light.

The light emitting device packages 30 of the light emitting module 1530 can be variously combined to provide various colors and brightness. For instance, the white LED, the red LED and the green LED can be combined to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

Meanwhile, the method of manufacturing the light emitting device according to the embodiment includes the steps of forming the light emitting structure by sequentially stacking the first conductive semiconductor layer, the active layer and the second conductive semiconductor layer on the silicon substrate; forming the conductive support member on the light emitting structure; selectively removing the silicon substrate and implanting one of n type conductive dopant and p type conductive dopant to form the body of the control switch; forming the source and drain regions by implanting the other of the n type conductive dopant and p type conductive dopant into the lower portion of the body; and forming the gate insulating layer making contact with the body and the source and drain regions and forming the gate electrode under the gate insulating layer.

According to the embodiment, the control switch can be formed on the top surface of the light emitting structure through a simple process with high efficiency, so that the on/off operation and/or the brightness of the light emitting device can be effectively controlled.

According to the embodiment, the light emitting device includes the control switch, so an additional component is not necessary to connect a switch to the light emitting device to control the operation of the light emitting device.

According to the embodiment, the light emitting device including the control switch having the simple structure can be manufactured through the simple process, so that the light emitting device is applicable in various fields.

According to the embodiment, the control switch is provided in the light emitting device, so that the electric disconnection between the switch components and the light emitting device can be prevented.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a first electrode;
a light emitting structure including a first semiconductor layer, an active layer and a second semiconductor layer on the first electrode;
a second electrode on the light emitting structure; and
a control switch provided on the light emitting structure to control the light emitting structure, wherein the control switch includes:
a body including a first dopant;
source and drain regions including a second dopant on the body;
a gate insulating layer on the body between the source and drain regions; and
a gate electrode on the gate insulating layer,
wherein the body of the control switch is directly disposed on a top surface of the second semiconductor layer and the first electrode is disposed on a bottom surface of the first semiconductor layer.

2. The light emitting device of claim 1, wherein the control switch controls an operation of the light emitting structure in response to a control signal.

3. The light emitting device of claim 2, wherein the control signal includes one of an on/off control signal or a gray-scale control signal.

4. The light emitting device of claim 1, wherein the control switch includes a semiconductor switch.

5. The light emitting device of claim 4, wherein the semiconductor switch includes a MOSFET switch.

6. The light emitting device of claim 1, wherein the control switch is formed at an outer peripheral region of the light emitting structure.

7. The light emitting device of claim 1, wherein the body includes silicon.

8. The light emitting device of claim 1, wherein the first dopant has the same polarity as the first semiconductor layer.

9. The light emitting device of claim 1, wherein the second dopant has the same polarity as the second semiconductor layer.

10. The light emitting device of claim 1, further comprising source and drain electrodes on the source and drain regions, respectively.

11. The light emitting device of claim 10, further comprising a wire between one of the source and drain electrodes and the second electrode.

12. The light emitting device of claim 1, wherein the control switch is connected to the light emitting structure in series.

13. The light emitting device of claim 1, further comprising at least one of a reflective layer or an ohmic contact layer between the first electrode and the light emitting structure.

14. The light emitting device of claim 1, further comprising a concave-convex pattern on the light emitting structure contacting the second electrode.

15. A light emitting device, comprising:
a first electrode;
a light emitting structure including a first semiconductor layer on the first electrode, an active layer on the first semiconductor layer and a second semiconductor layer on the active layer;
a second electrode on the second semiconductor layer;
a body on the second semiconductor layer;
source and drain regions on the body;
a gate insulating layer on the body between the source and drain regions; and
a gate electrode on the gate insulating layer,
wherein the second electrode is electrically connected to one of the source region or the drain region, and wherein both the body and the second electrode are directly disposed on a top surface of the second semiconductor layer.

16. A light emitting device package, comprising:
a package body;
a light emitting device on the package body; and
a molding member surrounding the light emitting device,
wherein the light emitting device includes:
a first electrode;
a protective member on an outer peripheral region of a top surface of the first electrode;
a light emitting structure including a first semiconductor layer, an active layer and a second semiconductor layer on the first electrode;
a second electrode on the light emitting structure; and
a control switch on the light emitting structure to control the light emitting structure, wherein the control switch includes:
a body including a first dopant;
source and drain regions including a second dopant on the body;
a gate insulating layer on the body between the source and drain regions; and
a gate electrode on the gate insulating layer,
wherein the protective member vertically overlaps at least a portion of the body of the control switch.

17. The light emitting device of claim 15, wherein the gate insulating layer is disposed on a top surface of the body.

18. The light emitting device of claim 15, wherein a portion of the second semiconductor layer at which the second electrode is directly disposed comprises a n-type conductive semiconductor layer, and wherein the body comprises a p-type conductive semiconductor layer.

19. The light emitting device of claim 1, wherein both of the body and the second electrode is directly disposed on the top surface of the second semiconductor layer.

20. The light emitting device of claim 1, further comprising a protective member on an outer peripheral region of a top surface of the first electrode, and
wherein the protective member vertically overlaps with the body of the control switch.

21. The light emitting device of claim 1, further comprising an ohmic contact layer between the first electrode and the light emitting structure,
wherein the ohmic contact layer contacts both of a side surface and a bottom surface of the protective member.

* * * * *